US005734598A

United States Patent [19]
Abbott et al.

[11] Patent Number: 5,734,598
[45] Date of Patent: Mar. 31, 1998

[54] LOW POWER FILTER COEFFICIENT ADAPTATION CIRCUIT FOR DIGITAL ADAPTIVE FILTER

[75] Inventors: William L. Abbott, Portola Valley; Hung C. Nguyen, San Jose, both of Calif.

[73] Assignee: Quantum Corporation, Milpitas, Calif.

[21] Appl. No.: 367,028

[22] Filed: Dec. 28, 1994

[51] Int. Cl.[6] .................. G06F 17/00; G11B 5/09
[52] U.S. Cl. ........................ 364/724.19; 360/39
[58] Field of Search .................. 364/724.01, 724.19, 364/724.2, 724.1; 360/39, 41, 42, 43, 44, 45, 46, 48, 51, 52, 77.07; 341/51, 100; 375/229, 230, 231, 232, 233, 234, 235

[56] References Cited

U.S. PATENT DOCUMENTS

| 5,132,988 | 7/1992 | Fisher et al. | 375/233 |
|---|---|---|---|
| 5,150,379 | 9/1992 | Baugh et al. | 375/14 |
| 5,216,629 | 6/1993 | Gurcan et al. | 364/724.19 |
| 5,220,466 | 6/1993 | Coker et al. | 360/46 |
| 5,258,933 | 11/1993 | Johnson et al. | 364/602 |
| 5,260,703 | 11/1993 | Nguyen et al. | 341/100 |
| 5,268,848 | 12/1993 | Coker et al. | 364/724.19 |
| 5,299,075 | 3/1994 | Hanks | 360/77.02 |
| 5,381,359 | 1/1995 | Abbott et al. | 364/724.19 |
| 5,384,806 | 1/1995 | Agazzi | 375/8 |
| 5,414,732 | 5/1995 | Kaufman | 364/724.19 X |

Primary Examiner—Chuong Dinh Ngo
Attorney, Agent, or Firm—David B. Harrison

[57] ABSTRACT

An adaptive filter for use in disk drive systems includes coefficient adaptation circuitry operating at a slower rate than the filter and consequently at a reduced power level. The adaptive filter receives input data samples corresponding to raw data read from a disk in the disk drive system and converted to digital form and provides processed output data samples. The action of the filter is defined by characteristic filter coefficients having values that are updated by adaptation circuitry during the operation of the filter. The adaptive filter is independently clocked from the adaptation circuitry, such that the input data samples and the processed output data samples are clocked through the adaptive filter at a clock rate 1/T, and the filter coefficients are updated according to a prescribed algorithm at an update rate slower than the 1/T clock rate. Filter coefficient updating occurs preferably at a rate equal to 1/J, where J is an integer greater than unity and generally in the range of 2 to 8. The coefficient update rate is achieved by providing a separate filter coefficient adaptation clock derived from the system clock by dividing that clock by a user-programmable parameter J. This process reduces the coefficient update rate, which in turn reduces the switching frequency of the logic gates, the number of pipeline latches, and, ultimately, the power consumption.

14 Claims, 8 Drawing Sheets

LOW POWER FILTER COEFFICIENT ADAPTATION CIRCUIT FOR DIGITAL ADAPTIVE FILTER

REFERENCE TO RELATED PATENT

This patent is related to commonly assigned U.S. patent application Ser. No. 07/936,761 filed on Aug. 27, 1992, now U.S. Pat. No. 5,381,359 issued on Jan. 10, 1995, for "Adaptation and Training of Digital FIR Filter Within PRML Class IV Sampling Data Detection Channel".

FIELD OF THE INVENTION

The present invention relates generally to adaptive filters for use in reading data from disk drives and is more particularly directed to adaptation circuitry used in adjusting filter coefficient values controlling the characteristics of the filter.

BACKGROUND OF THE INVENTION

In a magnetic disk storage system information is recorded on a disk having magnetic properties by inducing a pattern of magnetic variations on the disk encoding the information. The magnetic variations, sometimes referred to as magnetic flux changes or transitions, are recorded along concentric circular tracks on the disk. To satisfy the increasing demand for disk storage space, the computer industry is constantly striving to increase the recording density, i.e., the linear density with which the magnetic flux changes may be recorded along a track as well as the radial density of tracks on the disk. As the recording density is increased, however, the magnetic readback signal from the disk becomes more and more difficult to read and interpret due in part to so-called intersymbol interference resulting from the increased proximity of neighboring magnetic flux patterns along individual tracks and on adjacent tracks and due to other influences as well. For floppy disk drives and other drives with removable interchangeable disks, each disk may introduce its own irregularities into the readback signal due to naturally occurring variations within the manufacturing tolerances. Moreover, the irregularities are not uniform even over an individual disk, but depend to some degree on the radial position on the disk at which the data is being read.

The increased data densities on the disks have prompted the use of digital signal processing techniques to extract the data from noisy, distorted or otherwise irregular readback signals. In one common technique a sequence of consecutive raw data samples read from the disk is passed through a filter that keeps on-going track of the expected error in the signal and corrects the data samples accordingly. A popular class of filter for this purpose comprises the adaptive, finite-duration impulse response (FIR) filters. These filters may be viewed as time-varying signal processors that adapt their filter characteristic in real time to a sensed error measure. The filter characteristics are defined by time-varying coefficients, the values of which are adjusted at regular intervals in real time to minimize the on-going error measure. An adaptive FIR filter may be thought of as having two parts: a filter structure that processes the data stream in accord with the values of the filter coefficients, and an adaptation circuit that updates the values of the coefficients in the filter structure. Known implementations of such filter structures and adaptation circuits are subject to a number of drawbacks and compromises under the practical constraints of commercial disk drive systems, such as the following.

The dynamic power dissipated in conventional filter circuit implementations (assuming CMOS integrated-circuit technology commonly used for commercial disk drive electronics) is $$P = C \cdot V^2 \cdot f \cdot N_{gate} \quad (1)$$

where C is the average loading capacitance of a gate in the integrated-circuit chip, V is the power supply voltage level, f is the operating frequency, and $N_{gate}$ is the number of gates that are switching. Because improved performance is generally realized with a higher operating frequency f, the higher power dissipation levels associated with higher frequency are usually tolerated as a necessary tradeoff.

As may be seen from Eqn. (1), power consumption also goes up in direct proportion to the number of gates used in the particular implementation. A common integrated-circuit embodiment of the above filters is the tapped delay line, in which each of the coefficients characterizing the filter corresponds to a separate "tap" along a delay line. The number of gates goes up in proportion to the number of taps. A larger number of taps (i.e., filter coefficients) also leads to a greater delay for data to pass through the filter and thus limits the frequency at which the filter can operate. To compensate for this delay, data pipelining is often introduced to increase the filter operating frequency and the effective system throughput. However, pipelining calls for more gates, resulting in even greater power consumption.

In addition to the power demand, conventional filter coefficient adaptation circuits can introduce a bottleneck, constraining the system throughput. To provide updated filter coefficients in successive clock cycles as new data is clocked through the filter, conventional adaptation circuits require that the necessary computations be performed within one clock cycle. This limitation makes it difficult as a practical matter to increase the overall speed of the filter and of the data detection system as a whole and places a practical limitation in the circuitry and the algorithms that may be employed to update the coefficients.

Known filter adaptation circuitry used in disk drives also has the drawback that the updated coefficients are sometimes observed to wander away from their optimal values when the coefficient adaptation process is operated simultaneously with a "decision-directed" timing recovery loop. This wandering prevents a uniform and consistent convergence to the optimal values and impedes the filter performance.

SUMMARY OF THE INVENTION

The present invention provides an adaptive filter with coefficient adaptation circuitry that operates at a low power level, yet circumvents the above-mentioned problems and disadvantages prevalent in the prior art. A circuit according to the invention is able to achieve its reduced power dissipation without compromising the performance gains associated with higher system operating frequency f. In accordance with the above Eqn. (1) the invention achieves its lower power dissipation levels in part by reducing the frequency with which the adaptation circuitry operates and in part by reducing the number of Integrated-circuit gates activated at a time in the operation of the adaptation circuitry. An adaptive filter according to the invention overcomes the above-mentioned computational bottleneck associated with conventional adaptation circuitry. A filter according to the invention also minimizes the above-noted undesirable wandering of filter coefficients away from the optimal values.

Briefly, the invention achieves its advantages by independently clocking the adaptive filter and adaptation circuitry. In particular, the input data samples and the processed output data samples are clocked through the adaptive filter at a clock rate 1/T and the filter coefficients $\{w_m^{(k+1)}\}$ are updated according to a prescribed algorithm at an update rate slower than the 1/T clock rate. In particular, it has been found advantageous to update the filter coefficients at a rate equal to 1/JT, where J is an integer greater than unity and generally in the range of 2 to 8. In the embodiment disclosed herein, the independent coefficient update rate is achieved by providing a separate filter coefficient adaptation clock derived from the system clock by dividing the system clock by a user-programmable parameter J. This division reduces the coefficient update rate, which reduces the number of gates activated per unit time, the number of pipeline stages, and, ultimately, the power consumption. Since the update rate is decreased, the adaptation convergence rate will generally be slower than if the circuit were updated at the bit rate. Notwithstanding the slower convergence rate, other aspects of the filter performance, such as the ability to handle interruptions from embedded servo fields, are not compromised.

Other aspects, advantages, and novel features of the invention are described below or will be readily apparent to those skilled in the art from the following specifications and drawing of illustrative embodiments.

DETAILED DESCRIPTION OF A PREFERRED EMBODIMENT

Figure 1:
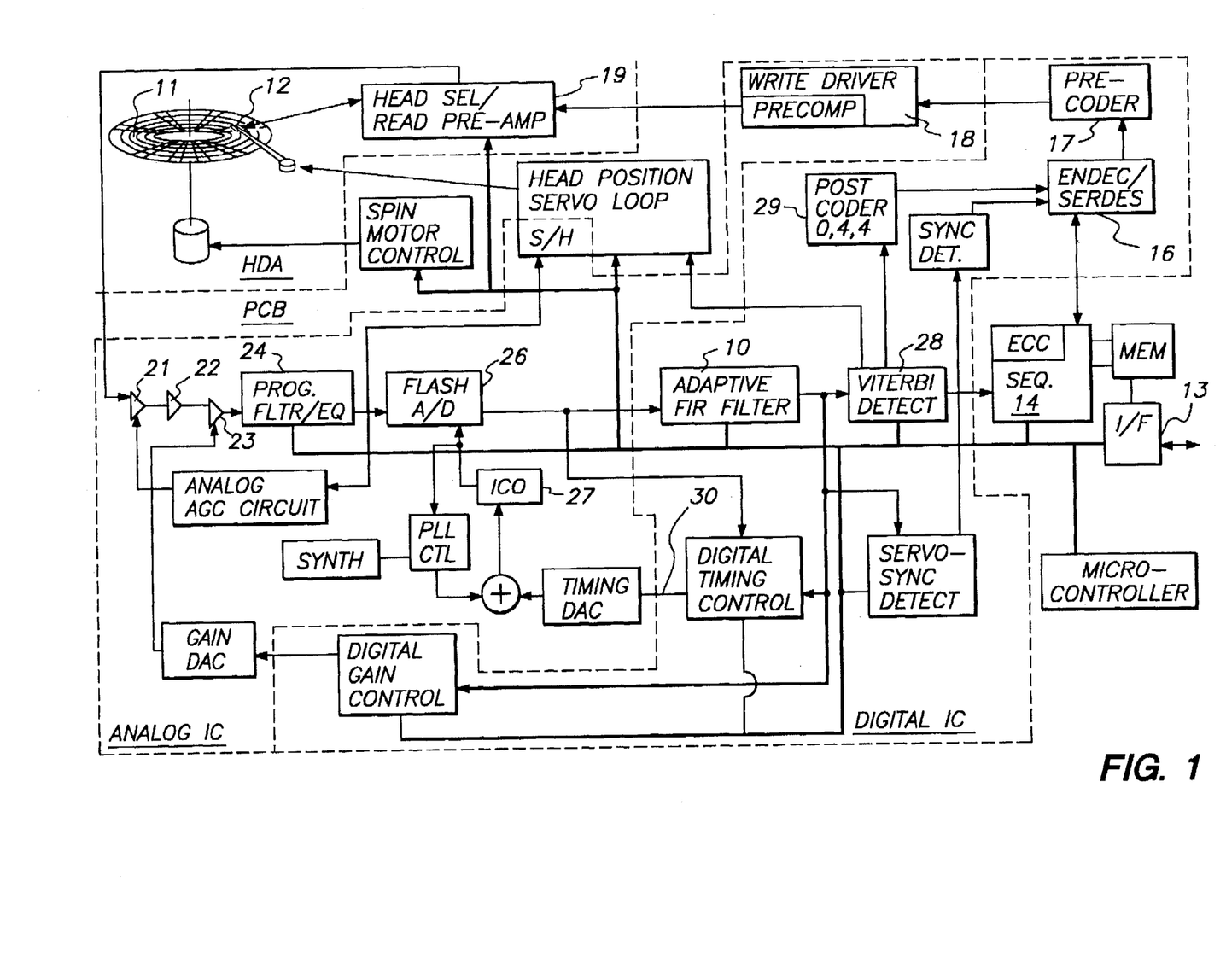
FIG. 1 is a block diagram of a disk drive system incorporating an adaptive filter according to the invention.

An understanding of the environment of an adaptive FIR filter in a disk drive system is beneficial before discussing the structure and operation of the filter and its adaptation circuit according to the invention. FIG. 1 is a block diagram of a disk drive system including as adaptive FIR filter 10. Data is recorded on disk 11 through the section of read/write head 12. Head 12 operates by inducing magnetic flux transitions on the disk (in a write operation) and by reading those transitions (in a read operating) as it moves across the surface of the disk.

Data to be written onto disk 11 enters the disk drive system through interface 13. After passing through a sequence 14, and having error correction coding information appended to it, the data then passes to an encoder/decoder, serializer/deserializer unit 16 (ENDEC/SERDES), which generates a stream of binary data. From ENDEC/SERDES 16 the binary data stream is applied to precoder 17, which precodes the data in accordance with a prescribed algorithm. As implemented, the present disk drive system employs a class IV partial response coding algorithm, although other coding algorithms may be used with the invention. The precoded binary data stream from precoder 17 is applied to write driver 18, which the binary data to a two-level (positive or negative) write current, which in turn is applied to head 12 through head select/read preamplifier mechanism 19. Head 12 induces the magnetic flux changes on the storage disk in response to the two-level write current.

To read the data from the disk, head 12 senses the flux changes as it moves over the disk and provides a positive or negative peaked signal indicative of the head's response to those flux changes. That signal is preamplified at head select/preamplifier unit 19 and is subjected to several extra stages of controlled amplification 21–23 before passing to a preliminary analog filter 24, which shapes the analog signal and enhances the signal-to-noise ratio. Flash A/D converter 26 then quantizes and samples the signal at intervals spaced by time T and produces a data stream at its output in the form of a sequence of raw digital data samples $\{x_k\}$. The sampling rate in A/D converter 26 is governed by a timing signal from ICO 27 that is properly synchronized and phase aligned with the incoming data stream.

The data samples from flash A/D converter 26 are applied to adaptive FIR filter 10 that is the subject of the present invention. Filter 10 filters and conditions the raw data samples $\{x_k\}$ in accordance with the desired response characteristic of the data channel (e.g., class IV partial response characteristics in the present example). The output of filter 10 is applied to a Viterbi detector 28, which extracts the data sequence and provides a binary data stream at its output. At this stage the binary data stream from Viterbi detector 28 in an ideal system reproduces the binary data stream that was written on the disk. Post-coder 29 then undoes the coding action that pre-coder 17 performed during the write operation, and the unprecoded data is then passed through the decoder section of ENDEC/SERDES 16 and through sequencer 14 to interface 13 in the reverse of the path followed in the write operation.

An exemplary Class IV PRML sampling data detection channel is described in greater detail in commonly assigned U.S. Pat. No. 5,341,249 issued on Aug. 23, 1994 and entitled: "Disk Drive Using PRML Sampling Data Detection with Digital Adaptive Equalization", the disclosure thereof being incorporated herein by reference thereto.

Figure 2:
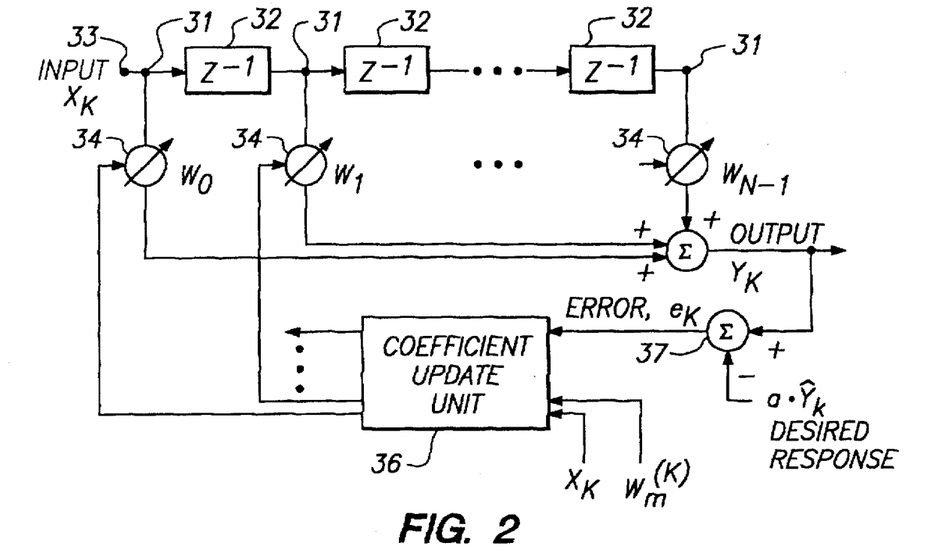
FIG. 2 is a generalized logic circuit diagram of an adaptive FIR filter.

FIG. 2 shows a generalized logic circuit diagram of an adaptive FIR filter 10. The filter comprises a delay line with N taps 31 and N−1 delays 32 connected progressively in tandem from the filter input line 33. N multiplier stages 34 are connected to the taps 31 progressively taken along the delays 32. N programmable multiplier coefficients designated $w_0, \ldots, w_{N-1}$ are also fed to the multiplier stages. These coefficients control the characteristics of the FIR filter 10. A value for each coefficient is held in a register feeding each multiplier stage.

The filter data stream $\{y_k\}$ is linearly related to the input data stream $\{x_k\}$ by the filter coefficients $\{w_m^{(k)}\}$:

$$Y_k = \sum_{m=0}^{N-1} X_{k-m} W_m^{(k)} \tag{2}$$

where $w_m^{(k)}$ is the value of the filter coefficient $w_m$ at time k as measured by the clock governing the data input rate at input 33, which will generally equal the sampling rate 1/T of flash A/D converter 26. The ability to modify the w coefficients permits the filter to be adapted to changing data channel conditions resulting, for example, from fly height variations, from temperature variations, from differences in tracks on a disk or differences in interchangeable disks in removable disk drive systems, or from defects in a disk developing over time.

Update unit 36 provides updated coefficients $w_m^{(k+1)}$ adapted for conditions at time k+1. The updated coefficients are derived according to a prescribed algorithm. The embodiment illustrated here used the well known least-mean-squares (LMS) algorithm, and in particular uses a variation known as the "signed-LMS" algorithm. The adaptation method of the present invention is not limited to this algorithm, however, and may readily be adapted for use with other algorithms.

According to the signed-LMS algorithm the vector of filter coefficients at time k+1, $\underline{w}^{(k+1)}$, is related to the coefficients at the time k as follows:

$$\underline{w}^{(k+1)} = \underline{w}^{(k)} - \mu e_k sgn(\underline{x}^{(k)}) \quad (3)$$

where μ is a programmable (i.e., scalable) step size and $e_k$ is the difference between the observed and desired filter responses:

$$e_k = y_k - a \cdot \hat{y}_k \quad (4)$$

determined in FIG. 2 at summing junction 37. Here $\hat{y}_k$ is normalized desired response, i.e., a normalized in desired filter output value being at time k, and this value scaled by the reference level a. This form is particularly useful where the reference levels are programmable, i.e., may be set by the user. The function sgn($\underline{x}$) is a vector with components defined by:

$$sgn(x^k) = \begin{cases} 1, x_i \geq 0 \\ -1, x_i < 0 \end{cases} \quad (5)$$

where $\underline{x}^{(k)} = [x_k, x_{k-1}, \ldots, x_{k-N+1}]$ is a vector of delayed filter input values, assuming an N-tap filter, and $x_i$ is the i-th component of $\underline{x}^{(k)}$. For pipelined filter circuits a delay "L" is built into the above algorithm as follows to allow for the pipelining:

$$\underline{w}^{(k+1)} = \underline{w}^{(k)} - \mu e_{k-L} sgn(\underline{x}^{(k-L)}) \quad (3')$$

The input data stream $\{x_k\}$ is clocked through filter 10 at rate 1/T so that at the k-th clock period the filter uses the vector $\underline{x}^{(k)}$ of the last N input values to determine the k-th processed output value $y_k$. In the past, implementations of adaptive filters used in disk drive systems have found it convenient to continue clocking the output values $y_k$ through error generator 37 and update unit 36 and to update the w coefficients with each clock cycle. The present inventors have discovered that update unit 36 may be slowed down considerably and that the w coefficients may be updated significantly less frequently than every clock with no appreciable degradation in filter performance. At the same time, a considerable saving in power dissipation is realized and an undesirable interaction of the filter with timing control signal on line 30 is greatly reduced. Apparatus for achieving these gains will now be described with reference to FIGS. 3–5.

Figure 3:
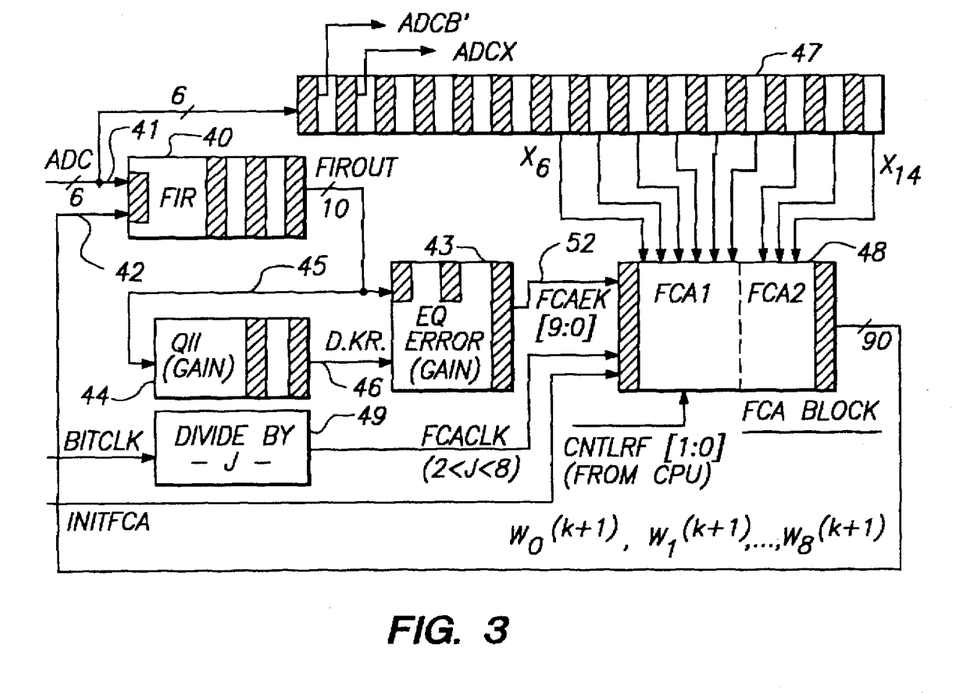
FIG. 3 is a circuit block diagram showing an embodiment of an FIR filter and coefficient adaptation circuitry according to the invention.

FIG. 3 shows an embodiment of adaptation circuitry according to the invention for adapting the coefficients of adaptive FIR filter 40. Filter 40 receives data sequences $\{x_k\}$ at data input 41. The values of the filter coefficients $\{w_m^{(k)}\}$ are provided to the coefficients input 42. Error generator 34 generates the error term $e_k$ in Eqn. (3) or (3') above. Quantizer block 44 receives the filter output values $y_k$ along line 45 and quantizes those value into three levels (in accordance with class IV partial response assumed in the present example). Error generator 43 also receives the filter output values $y_k$ along line 45 and receives the quantized values from quantizer block 44 at line 46. To generate the filter error signal, error generator 43 determines the difference between the filter output and the quantizer output.

Shift register 47 receives the input data stream $\{x_k\}$ and produce the vector $\underline{x}_{(k-L)} = [x_{k-L}, x_{k-L-1}, \ldots, x_{k-L-N+1}]$ of delayed inputs used to update coefficients $\{w_k\}$. In the illustrated case, L=7. Filter coefficient adaptation block 48 receives the input $\underline{x}^{(k)}$ from shift register 47 and implements the intermittent updating of coefficients according to the invention. In the illustrated embodiment the rate at which the filter coefficients are updated is controlled by a special filter coefficient adaptation clock signal (FCACLK) provided by FCA clock 49. As implemented here FCA clock 49 merely divides the system bit clock signal (Bitclk) by a programmable (i.e., user selectable) integer J. If an integer J is selected that is too high, so that the coefficients are updated too infrequently, degradation in the filter performance will be observed. Practitioners in the art will readily be able to determine empirically for any given filter implementation the acceptable upper limit on J that still yields acceptable filter performance. For the illustrated embodiment a value of J from 2 to 8 has been found acceptable. Adaptation block 48 receives the error signals $\{e_k\}$ from error generator 43 and receives the divided clock signal from FCA clock 49. The output from adaptation block 48 is the vector of updated coefficients $\underline{w}^{(k+1)}$.

Adaptation block 48 in FIG. 3 also receives reset signal INITFCA which is used to initialize the block, and control signal CNTLRF which is used to set the adaptation mode of the block. This control signal CNTLRF provides an extra measure of control that allows the coefficients to be set by alternative modes of operation.

Figure 4A:
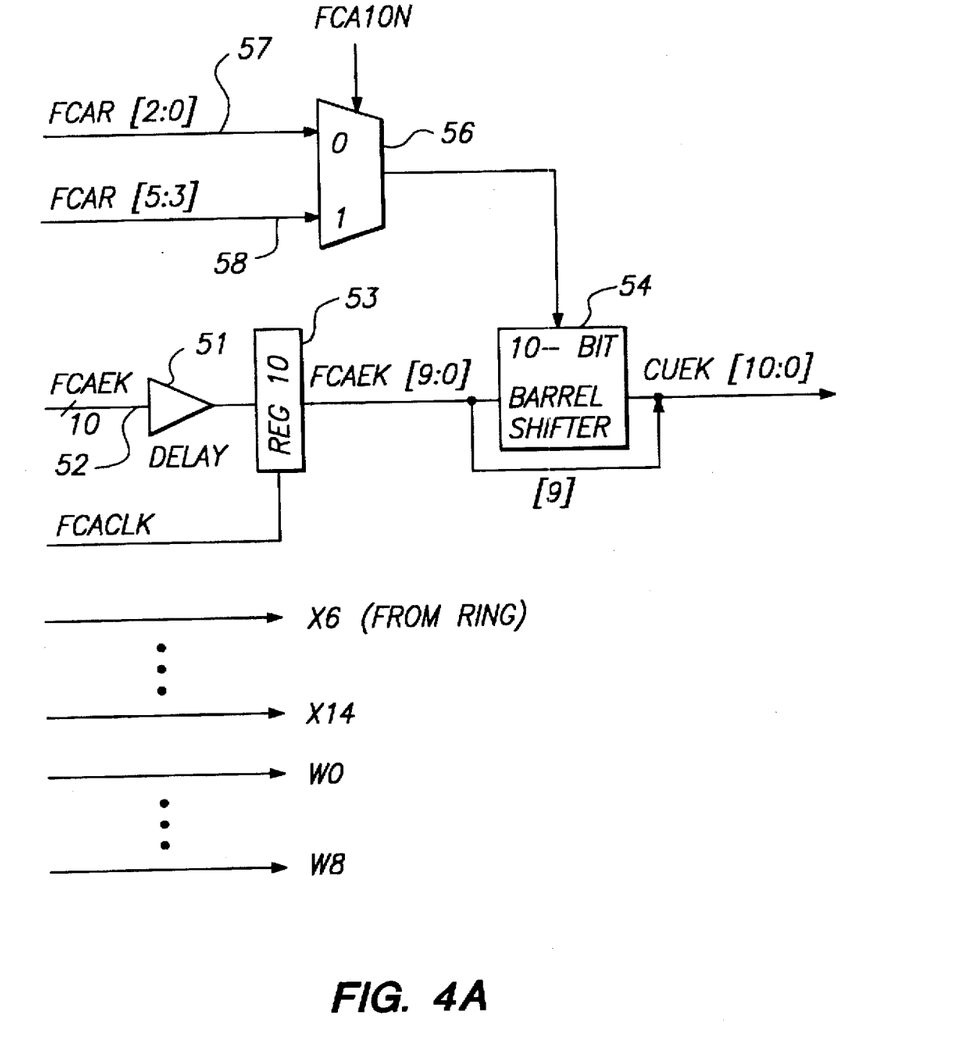
FIGS. 4A and 4B are circuit block diagrams showing the input and intermediate stages of the filter coefficient adaptation block of FIG. 3.
Figure 4B:
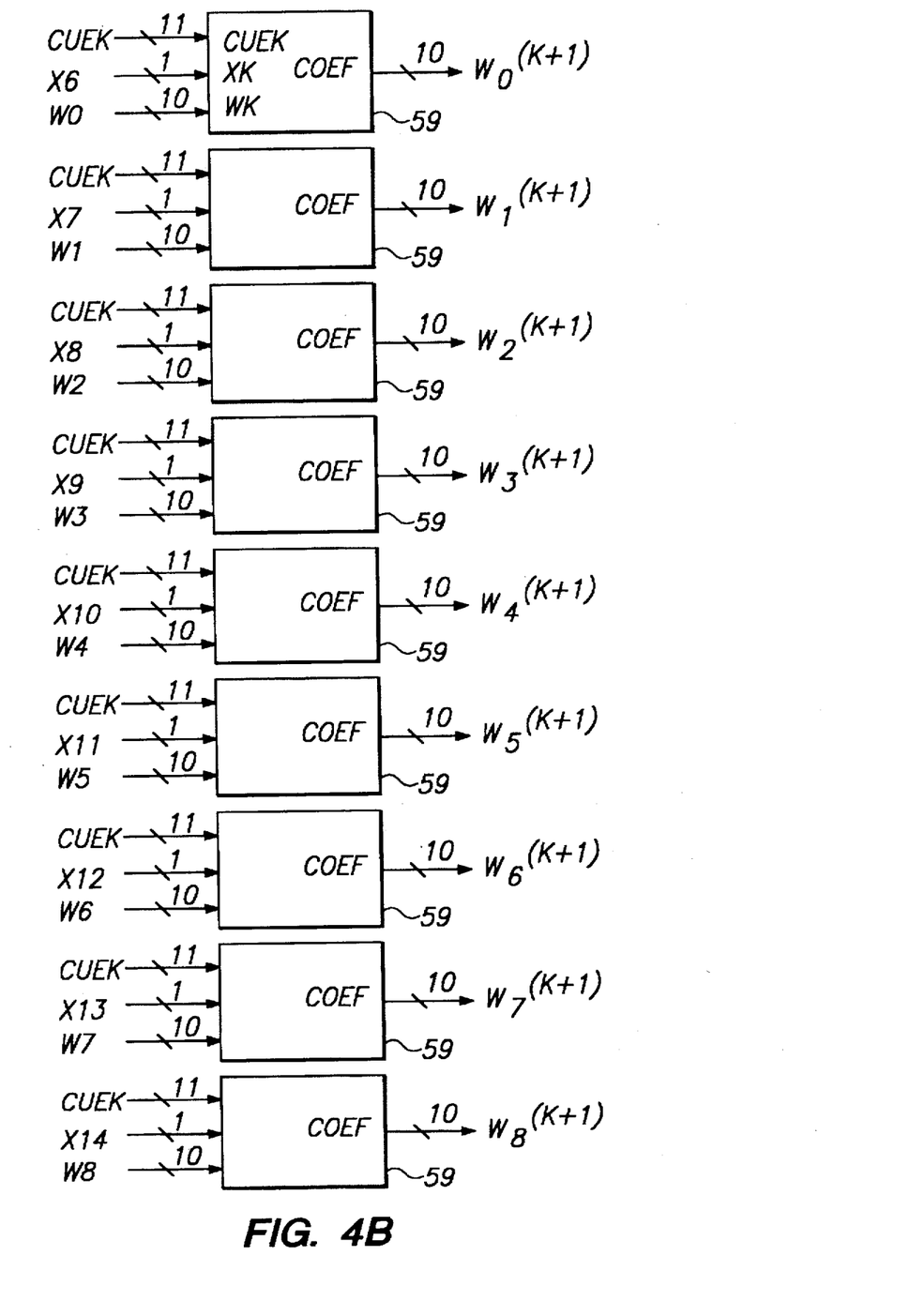

FIGS. 4A and 4B show the input section of the adaptation block, referred to as FCA1 in FIG. 3. The error values $\{e_k\}$ from error generator 43 (i.e., the signals labeled FCAEK) are stored for use in updating the filter coefficients. In the embodiment of FIG. 4A the error values are applied through delay 51 along line 52 to ten-bit register 53 for storing the error values until needed in the update operation. Error generator 43 generates error values $e_k$ on every time step k from the bit clock driving the filter. The register 53 holds the error values until clocked through to barrel shifter 54 in response to the filter adaptation clock signal FCACLK. The FCACLK signal clocks every J-th value of $e_k$ through to barrel shifter 54 where J is the integer value dividing the bit clock rate as explained above. Thus, the output of register 53 change only with every J-th time step of the bit clock. Barrel shifter 54 receives the error value $e_k$ and shifts it to the right by a predetermined number of places specified by the value of μ from Eqn. (3) or (3'). The μ value is selected by multiplexer 56, which provides either a larger or smaller step size μ corresponding to a faster or slower adapt mode. The μ values are three-bit value stored in register files (not shown) and provided to multiplexer 56 along the FCAR lines 57 and 58. FCA10N is a control line for selecting the step size. If the value on this control line is zero, then the top μ value along line 57 is selected. If the control line value is one, then the bottom μ value is selected. The output of barrel shifter 54 is the error value CUEK scaled by μ.

FIG. 4B shows the next stage of adaptation block 48. The individual coefficient blocks 59 calculate the new coefficient values according to Eqn. (3) or (3'), which are then provided to the output stage of adaptation block 48 labeled FCA2 in FIG. 3 and shown in more detail in FIG. 6.

Figure 5:
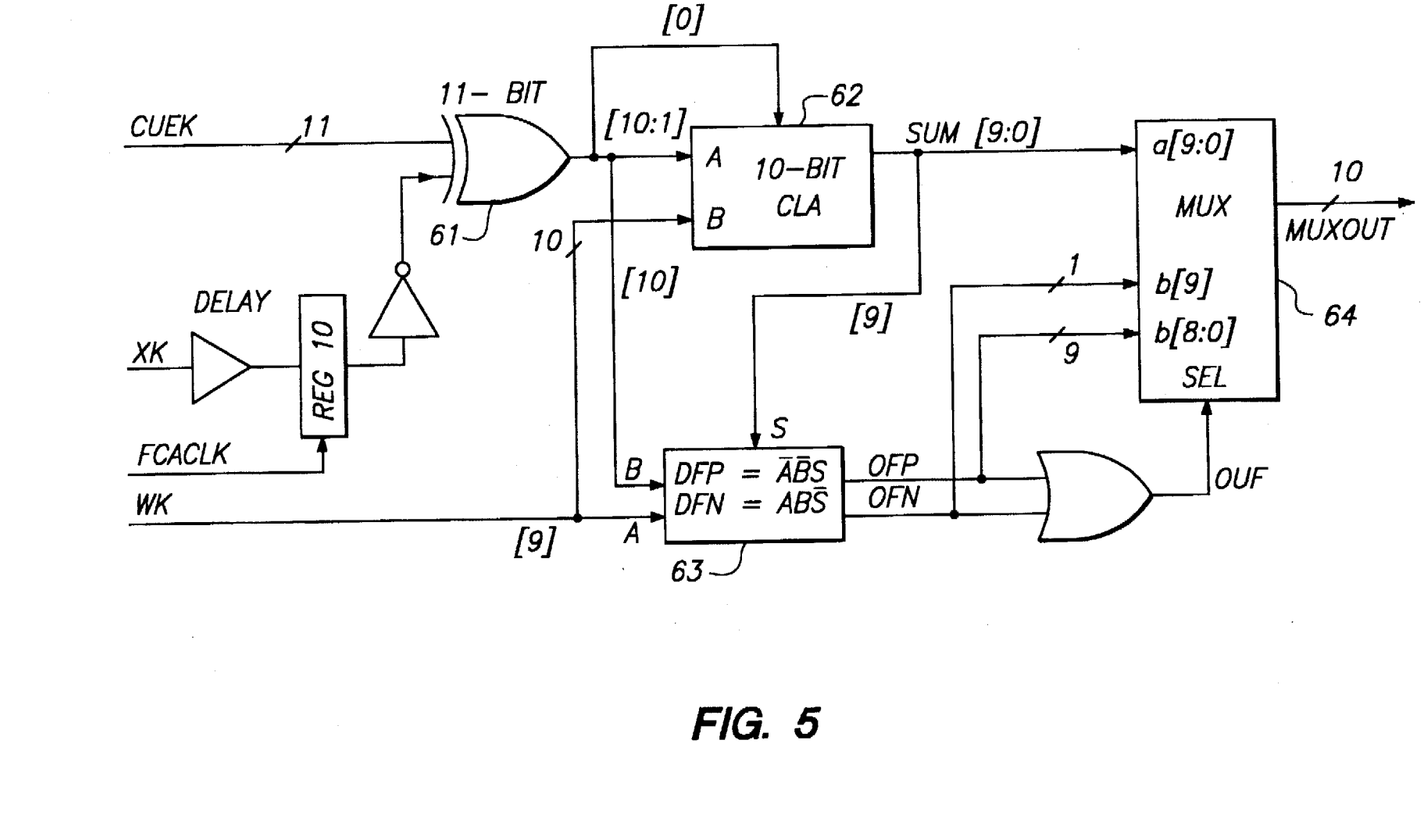
FIG. 5 is a circuit block showing a coefficient calculating block from FIG. 4B in more detail.

FIG. 5 shows a coefficient block 59 in more detail. The inputs to FIG. 5 have already been defined above. The diagrammatic gate 61 represents a bank of eleven XOR gates. These gates flip the sign of the $\mu e_k$ term from Eqn. (3) (or the corresponding term in Eqn. (3')). The total update value is then provided at the output of the bank of XOR gates 61. This value is subtracted from the old w value by adder 62. A rounding bit is applied to adder 62 at the carry input CIN. Block 63 checks for overflow of adder 62. Multiplexer 64 selects either the saturated value arising from an overflow or the actual sum output. The multiplexer output MUXOUT is the new w coefficient.

Figure 6:
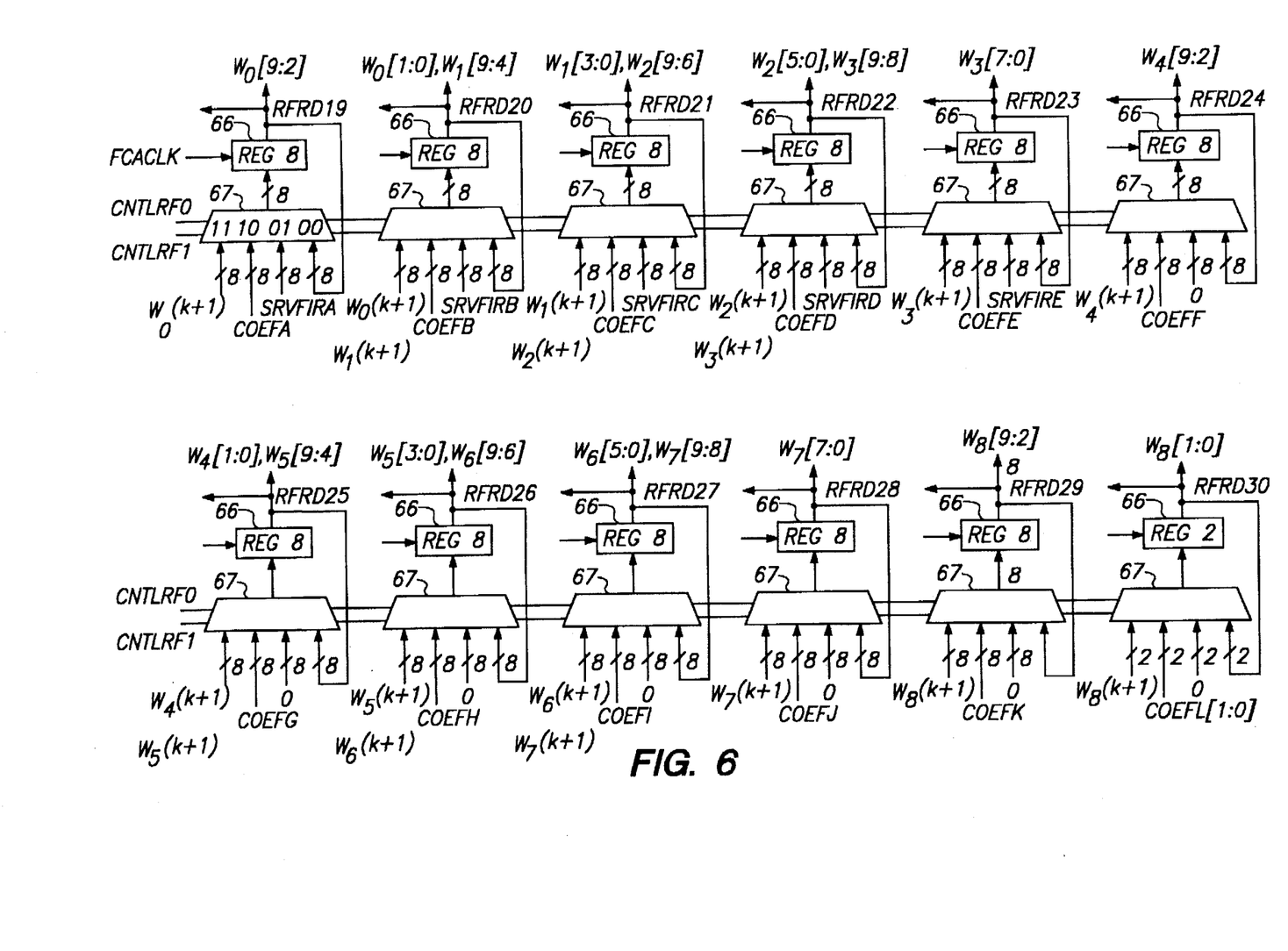
FIG. 6 is a circuit block showing the output stage of the filter coefficient adaptation block of FIG. 3.

FIG. 6 shows the output stage FCA2 of adaptation block 48. A plurality of output registers 66 hold the output values of the filter coefficients to be sent to FIR filter 40. Multiplexers 67 select the coefficients to be sent to registers 66 depending on the state of the control bits along control lines CNTLRF0 and CNTLRF1. If the control bits are 00, then the stored values in registers 66 continue to be sent. If the control bits are 01, then the servo mode settings SRVFIRA to SRVFIRE are selected. If the control bits are 10, then a pre-programmed value from a register file is selected. If the control bits are 11, then updated coefficient values $w^{(k+1)}$ are sent to registers 66.

Figure 7:
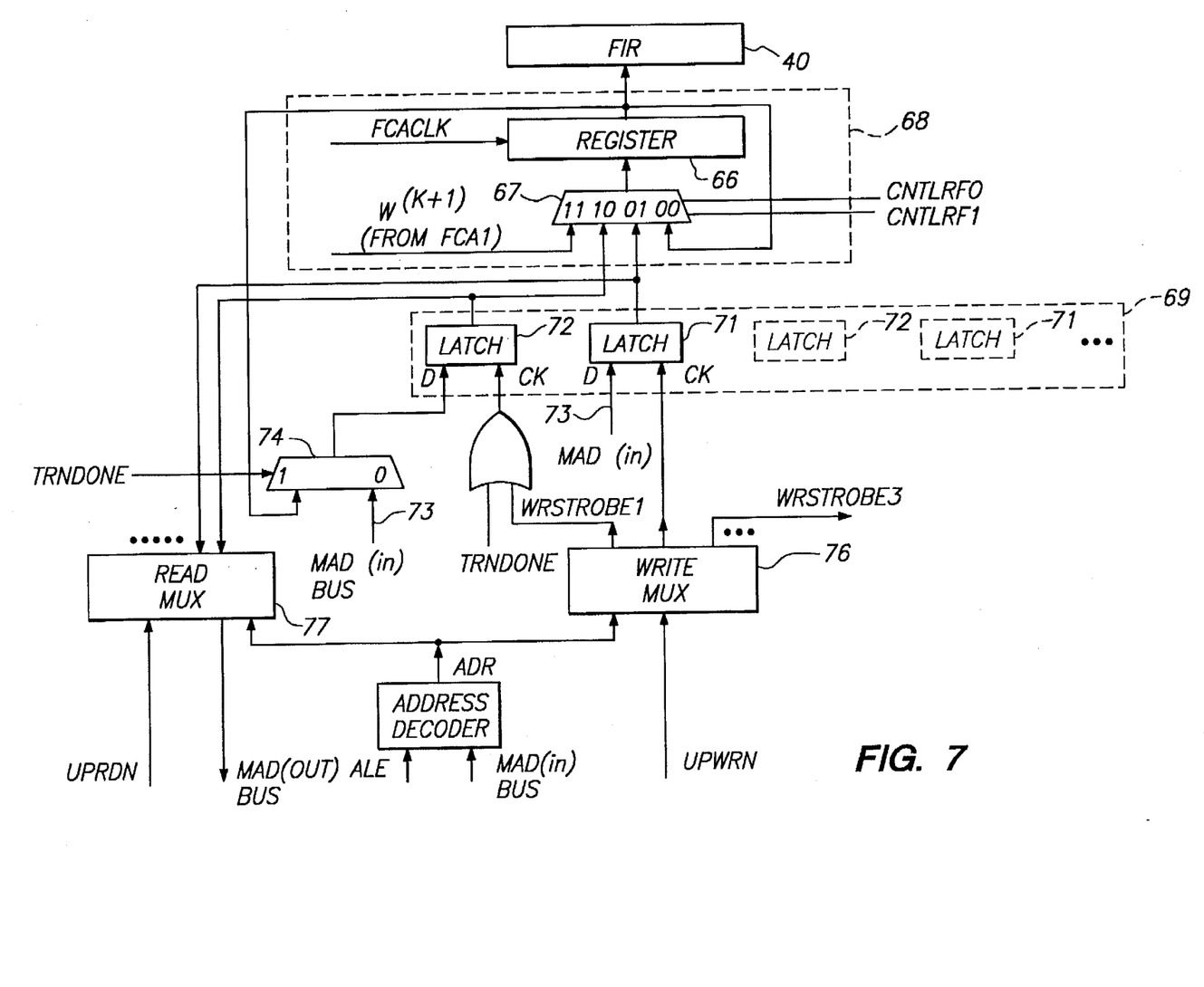
FIG. 7 is a circuit block diagram showing a coefficient storage scheme used with the output stage of FIG. 6.

While reading data from disk 11, the coefficients are normally updated continually and generally converge quickly to optimum value for the particular track and disk being read. When the coefficients are updated according to the invention at the slower FCACLK rate, the rate of convergence is correspondingly slower. This can present a problem when embedded servo data are present on the disk. In a common track format servo fields or "wedges" are embedded at intervals along a track, the servo fields commonly defining and separating wedge-shaped areas on the disk for user data storage. If the embedded servo values are recorded at different rates than the effective user data rate, it becomes generally desirable to provide alternative predetermined filter coefficients when reading the servo and identification information from the servo fields. Thus, in this case the filter coefficient updating mechanism is interrupted when reading the servo fields. With adaptive filters of the prior art ample time is generally available between servo wedges on the disk for the updated filter coefficients to converge to their optimum values. When the update rate is slowed down, however, convergence may not be achieved between servo wedges. This may particularly be undesirable where a data segment is too large to be stored in a contiguous field on the disk, but is stored a split data field interrupted by a servo wedge. FIG. 7 shows an implementation of circuitry associated with an individual register 66 and multiplexer 67 which selects the coefficients so as to tolerate the slow convergence rate problem.

Block 68 in FIG. 7 shows a representative output register 66 and associated multiplexer 67 from the output stage FCA2 of adaptation block 48 in FIG. 6. Block 69 comprises a register file for holding alternative coefficient values. Register file 69 includes a servo latch 71 and coefficient latch 72 for each of the registers 66. Servo latch 71 receives preprogrammed coefficients at the data input D from microprocessor address/data bus 73. Coefficient latch 72 receives coefficient values from multiplexer 74 which selects the values from microprocessor address/data bus 73, or from output register 66, depending on the value of the control signal TRNDONE. Write Multiplexer 76 provides write strobe signals for writing servo or preprogrammed data values to the latches 71 and 72. Read multiplexer 77 is used to read out the coefficient values stored in latch 71 and 72 and allows one to read the converged coefficient values.

The various states of the alternative coefficient mechanism discussed above in connection with FIG. 6 may now be better understood with reference to FIG. 7. When the control lines CNTLRF0 and CNTLRF1 are in the 00 state, output register 66 merely holds the previous coefficient values. The 01 state selects the servo coefficients held in servo latch 71. The 01 state is selected when the servo mode is enabled. When the 10 state is selected, output register 66 receives data values from coefficient latch 72. Multiplexer 74 can select either preprogrammed data coefficients from microprocessor address/data bus 73 or can select the last w coefficients that were present in output register 66.

In operation, the arrangement of FIG. 7 functions as follows. When reading data on the disk, the TRNDONE signal is asserted at the end of the data segment to indicate that a servo wedge follows. TRNDONE causes multiplexer 74 to select the last values achieved from the adaptation process in the immediately completed data field. The previously adapted values are saved in coefficient latch 72. If TRNDONE is de-asserted, then preprogrammed data coefficients are selected instead. In the servo mode the coefficients are selected from servo latch 71. When the system next returns to the read mode, the coefficients in latch 72 are selected so that the adaptation unit may continue adapting these coefficients where it left off before the read mode was interrupted. When returning to the read mode, the system switches to state 11, which is the adaptive mode. The system then continues to select the new coefficients from FCA1 (FIG. 4B) based on the feedback values attained before the read operation was interrupted.

Figure 8:
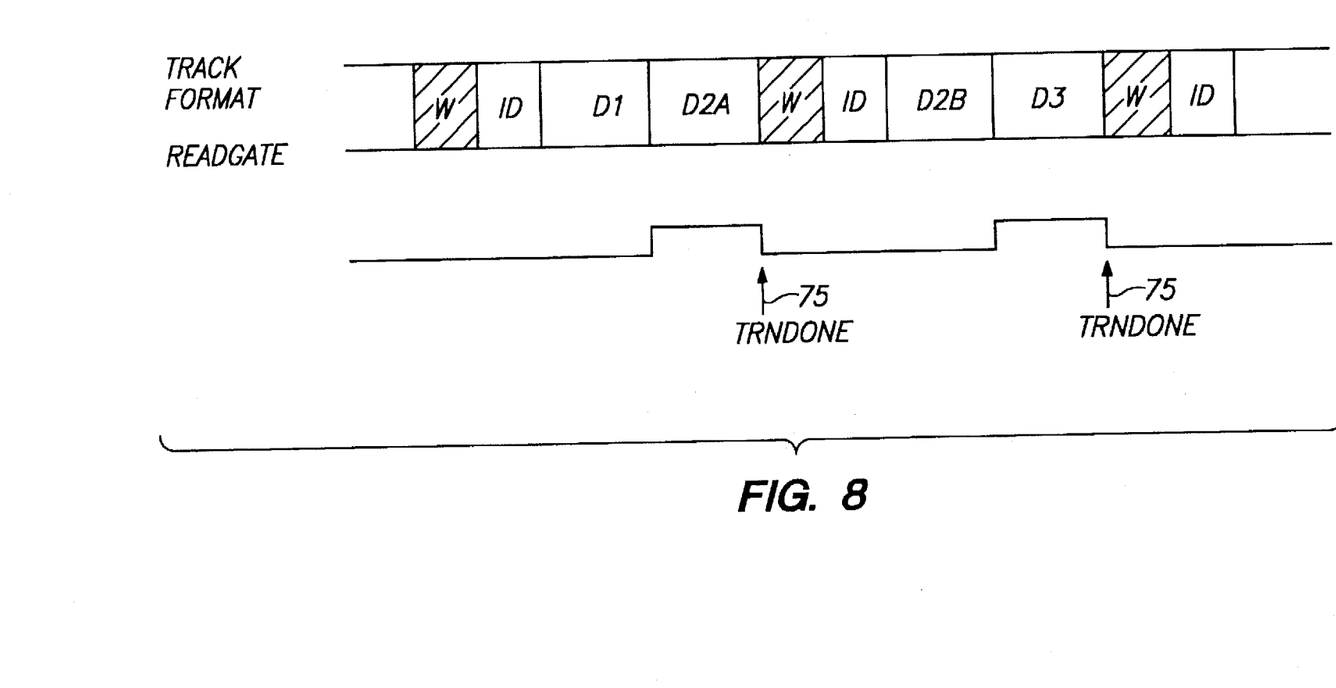
FIG. 8 shows a sample disk track format and associated signals illustrating filter coefficient switching.

FIG. 8 shows a sample disk track format and an associated READGATE signal and TRNDONE signal illustrating this process. The W segments represent servo wedges. ID is an identification field immediately following a servo wedge. D1, D2, and D3 are data fields. D2 is a split data field that corresponds to a data segment too long to fit into one field without being interrupted by a servo wedge and ID field. D2 is composed of the non-contiguous fields D2A and D2B. When TRNDONE is asserted, indicated by the arrows 75, the latest FIR filter coefficients are saved into the coefficient latches 72 of register file 69. Servo coefficients SRVFIR are loaded into register 66 from servo latch 71. At the beginning of the segment D3 (indicated by the rising edge of the READGATE signal in FIG. 8) the previously trained FIR filter coefficients from latch 72 are loaded back into register 66. These coefficients then continue to train by setting CNTLRF to 11. This scheme achieves a continuous training process with minimal microprocessor interruption notwithstanding the slower adaptation convergence rate occasioned by the slower FCACLK rate.

It has been found that independently controlling the adaptation circuitry timing and the filter circuitry timing according to the invention also provides an effective solution to another problem associated with adaptive filters. When data is read from a disk, it is necessary for the clock signal for A/D converter 26 to be synchronized with the clock signal that was used for writing the data in the disk initially. This can be problematic because the precise frequency with which the data was written to the disk is not generally known. To circumvent this problem, disk drive systems commonly include an adaptive timing loop to adjust the clock signal. The adaptive timing loop generally uses the same error signals $e_k$ that adaptive FIR filter 10 (or filter 40 in FIG. 3) uses. The result is an interaction between the two adaptive loops that causes the FIR filter coefficient values to wander away from the optimum values instead of converging definitively to these values. The present invention provides a practical solution to this problem by updating the filter coefficients more slowly than the timing loop, which is updated in every cycle. If coefficients are updated every 5th or 6th time, for example, then the wandering within one data sector time interval becomes small enough to be insignificant in practice.

The above descriptions and drawings disclose illustrative embodiments of the invention. Given the benefit of this disclosure, those skilled in the art will appreciate that various modifications, alternate constructions, and equivalents may also be employed to achieve the advantages of the invention. Therefore, the invention is not to be limited to the above description and illustrations, but is defined by the appended claims.

What is claimed is:

1. In a clocked digital adaptive filter for processing data stored in a disk drive system, said digital adaptive filter receiving digital input data samples corresponding to data read from a disk in said disk system, said digital filter being clocked at a clocking period T and providing processed digital output data samples linearly related to a sequence of said digital input data samples at time k by a plurality of filter coefficients $\{w_m^{(k)}\}$, and including a digital adaptation unit for updating said filter coefficients $\{w_m^{(k)}\}$, said digital adaptation unit providing updated coefficients $\{w_m^{(k+1)}\}$ at time k+1 according to a prescribed algorithm, the improvement characterized in that:

said digital adaptation unit is structured and arranged to provide updated digital filter coefficients $\{w_m^{(k+1)}\}$ according to said prescribed algorithm whenever k is equal to 1/JT where J is a predetermined integer clocking quotient factor greater than unity and said digital adaptation unit is structured and arranged not to update said coefficients otherwise, and wherein said digital adaptation unit comprises:

a first clock providing the clocking period T governing the rate of operation of said filter;

an adaptation clock providing an adaptation clocking period JT governing the rate of operation of said digital adaptation unit, error generator means for providing error values for use in updating said filter coefficients;

error value storing means connected to said error generator means for storing said error values, wherein said error value storing means provides stored error values for use in said updating in response to said adaptation clock, error scaling means receiving said stored error value from said error value storing means in response to said adaptation clock signal for scaling said error value by a selectable step size for use in said updating, and step size selector means for providing a selected step size to said shift register such that a larger step size is selected for a faster filter coefficient adaptation mode and a smaller step size is selected for a slower filter coefficient adaptation mode.

2. The apparatus of claim 1 wherein said filter coefficients are updated according to a least-mean-square algorithm.

3. The apparatus of claim 2 wherein said filter coefficients are updated according to a signed least-mean-square algorithm.

4. The apparatus of claim 1 wherein said integer J lies in a range between 2 and 8 and is user selectable.

5. The apparatus of claim 1 wherein said adaptation clock comprises a divider for receiving and dividing said first clock by the integer J.

6. The apparatus of claim 1 wherein said error generator means is connected to receive digital output data samples from an output of said digital filter.

7. The apparatus of claim 1 wherein said error value storing means comprises a barrel shifter shift register.

8. The apparatus of claim 1 wherein said step size selector means comprises a multiplexer having a first input for receiving the larger step size and a second input for receiving the smaller step size.

9. A method of processing data stored in a disk drive system using a digital adaptive filter, said digital adaptive filter receiving input digital data samples corresponding to data read in said disk drive system, and providing processed output digital data samples linearly related to a sequence of said input digital data samples at time k by a plurality of filter digital coefficients $\{w_m^{(k)}\}$, and including a digital adaptation unit for updating said filter digital coefficients $\{w_m^{(k)}\}$, said digital adaptation unit providing updated digital coefficients $\{w_m^{(k+1)}\}$ at time k+1 according to a prescribed algorithm, said method comprising the steps of:

clocking said input digital data samples through said digital adaptive filter and providing said processed output digital data samples from said digital adaptive filter at a sample clock rate 1/T;

generating error values from said samples;

scaling said error values in accordance with a variable step size to produce scaled error values;

selecting said variable step size whereby a larger step size is selected for a faster filter coefficient adaptation mode and a smaller step size is selected for a slower filter coefficient adaptation mode; and updating said digital coefficients $\{w_m^{(k+1)}\}$ with said scaled error values according to said prescribed algorithm at a controlled update rate.

10. The method of claim 9 wherein said update rate is slower than said clock rate and is equal to 1/JT where J is a user-selectable integer greater than unity.

11. The method of claim 10 wherein J is an integer lying in a range between two and eight.

12. An adaptive digital filter in a partial response, maximum likelihood data detection channel of a disk drive having a rotating data storage disk with at least one data storage surface and a data transducer head positionable relative to concentric data tracks of the surface, the tracks comprising data sections interrupted by servo wedge sections, at least one user data block spanning a said servo wedge section, the channel comprising analog-to-digital converter means for converting the user data block read from a data track into raw digital data samples at a data sampling rate of 1/T and for converting servo information from the said servo wedge section into servo samples for use by a data transducer head positioner of the drive, data clock means for generating and supplying the data sampling rate of 1/T to the analog-to-digital converter means, and Viterbi detector means for maximum likelihood detection of filtered digital data samples, the adaptive digital filter comprising:

a multi-tap transversal finite impulse response filter connected between said analog-to-digital converter means and said Viterbi detector means, and having coefficient multipliers for each tap, for putting out filtered digital samples from the raw digital data samples filtered in accordance with filter adaptive data coefficients and for putting out filtered servo samples in accordance with filter servo coefficients, storage means for storing and providing the filter adaptive data coefficients to the coefficient multipliers of the multi-tap finite impulse response filter during reading of the at least one user data block and for storing and providing the filter servo coefficients to the coefficient multipliers during reading the said servo wedge section, clocked digital filter adaptation means for generating updated filter adaptive data coefficients from data samples from the channel and for supplying updated filter adaptive data coefficients to the storage means, clocking control means for generating an adaptation clock for clocking the clocked digital filter adaptation means and the storage means at a rate slower than the data sampling rate, the storage means including latch means for holding a last set of updated filter adaptive data coefficients before reading of the said servo wedge section and for providing the last set of updated filter adaptive data coefficients to the filter upon resumption of the at least one user data block following reading of the said servo wedge section, thereby enabling continuing adaptation and convergence of the filter adaptive data coefficients following reading of the said servo wedge section.

13. The adaptive digital filter set forth in claim 12 wherein the clocking control means generates the adaptation clock at a rate corresponding to 1/JT where J is a user-programmable integer lying in a range between 2 and 8.

14. The adaptive digital filter set forth in claim 12 wherein the data clock means includes a timing acquisition control loop operating at a timing acquisition clock rate, and wherein the clocking control means generates the adaptation clock at a rate slower than the timing acquisition clock rate.

* * * * *